(12) United States Patent
Hwang

(10) Patent No.: US 6,870,360 B2
(45) Date of Patent: Mar. 22, 2005

(54) APPARATUS FOR RECOGNIZING WORKING HEIGHT OF DEVICE TRANSFER SYSTEM IN SEMICONDUCTOR DEVICE TEST HANDLER AND METHOD THEREOF

(75) Inventor: Hyun Joo Hwang, Kyonggi-do (KR)

(73) Assignee: Mirae Corporation, Chungchongnam-Do (KR)

( * ) Notice: Subject to any disclaimer, the term of this patent is extended or adjusted under 35 U.S.C. 154(b) by 22 days.

(21) Appl. No.: 10/321,560

(22) Filed: Dec. 18, 2002

(65) Prior Publication Data

US 2003/0173949 A1 Sep. 18, 2003

(30) Foreign Application Priority Data

Mar. 13, 2002 (KR) ........................................ 2002-13539

(51) Int. Cl.[7] ............................................. G01R 31/02
(52) U.S. Cl. .................................... 324/158.1; 324/758
(58) Field of Search ................................ 324/754, 755, 324/756, 757, 758, 762, 765, 158.1, 761; 414/786, 764, 754

(56) References Cited

U.S. PATENT DOCUMENTS

| | | | | |
|---|---|---|---|---|
| 5,290,134 A | | 3/1994 | Baba ........................ | 414/404 |
| 5,530,374 A | * | 6/1996 | Yamaguchi .................. | 324/758 |
| 5,631,573 A | * | 5/1997 | Ohno .......................... | 324/754 |
| 5,982,132 A | * | 11/1999 | Colby ......................... | 318/649 |
| 6,346,682 B2 | * | 2/2002 | Kim et al. .................. | 209/573 |
| 6,445,203 B1 | * | 9/2002 | Yamashita et al. .......... | 324/760 |
| 6,518,745 B2 | * | 2/2003 | Kim et al. ............... | 324/158.1 |

FOREIGN PATENT DOCUMENTS

JP         8272453         10/1996

* cited by examiner

Primary Examiner—David Zarneke
Assistant Examiner—Tung X. Nguyen
(74) Attorney, Agent, or Firm—Fleshner & Kim, LLP

(57) ABSTRACT

An apparatus and method are provided for recognizing a working height of a device transfer system in a semiconductor device test handler which allows the working height of the device transfer system to be quickly measured and/or precisely reset. The device transfer system moves horizontally and vertically on a handler body of the semiconductor device test handler, and moves horizontally and vertically, and includes a plurality of pickers which pick up the semiconductor devices. An elevating block installed at one side of the device transfer system moves upward and downward, and a touch probe installed vertical relative to the elevating block moves upward and downward based on contact with a target object. A detector detects ascendance of the touch probe upon contact with the target object, and a working position is determined based on an initial position, a measured position, and a series of offset values.

30 Claims, 6 Drawing Sheets

APPARATUS FOR RECOGNIZING WORKING HEIGHT OF DEVICE TRANSFER SYSTEM IN SEMICONDUCTOR DEVICE TEST HANDLER AND METHOD THEREOF

This application claims the benefit of the Korean Application No. P2002-13539 filed on Mar. 13, 2002, which is hereby incorporated by reference.

BACKGROUND OF THE INVENTION

1. Field of the Invention

The present invention relates to an apparatus for recognizing a working height of a carrier in a semiconductor device test handler, and more particularly, to an apparatus and method for recognizing a working height of a carrier in a semiconductor device test handler enabling to measure to reset the working height of the carrier in accordance with a species of the semiconductor devices and replacing components such as a tray and a change kit fast and precisely when various kinds of semiconductor devices are tested in the handler.

2. Discussion of the Related Art

Generally, semiconductor devices produced in a production line undergo tests for checking whether to be good or fail before shipment.

A handler is a device for testing such semiconductor devices. The handler uses a semiconductor device carrier to transfer semiconductor devices received on a tray to another process line automatically, loads the semiconductor devices on a test socket of a test site to carry out a demanded test thereon, and classifies the tested semiconductor devices into various levels to unload them on the tray. The handler carries out such steps repeatedly to perform the tests.

FIG. 1 illustrates a layout of a general handler for semiconductor device test.

Referring to FIG. 1, in a front part of a handler body 1, formed are a loading unit 2 on which trays receiving test-expecting semiconductor devices thereon are loaded and an unloading unit 3 having a plurality of trays receiving test-completed semiconductor devices classified into good products and fail products in accordance with test results. And, a soaking plate 7 is installed in rear of the loading unit 2. The soaking plate 7 includes a heating means (not shown in the drawing) and a cooling means (not shown in the drawing) inside to heat or cool the test-expecting semiconductor devices to a predetermined temperature for temperature test.

And, a reject multi-stacker 5, on which a plurality of trays are loaded to receive the semiconductor devices classified by grade into the fail product's according to the test results, is installed in rear of the unloading unit 3.

In a test site 10 located at the foremost rear part of the handler body 1, at least one test socket 11 connected electrically to an external testing device is installed to test a performance of each of the semiconductor devices. Over the test socket 11, formed are first and second index heads 12a and 12b installed to move horizontally to pick up to load the semiconductor devices, which are transferred to standby positions at both sides of the test socket 11, on the test sockets 11 as well as to pick up to retransfer the tested semiconductor devices on the test sockets 11 to the standby positions at both sides.

In the very front of the test site 10, first and second shuttles 8a and 8b are installed to move back and forth. The first and second shuttles 8a and 8b receive to transfer the semiconductor devices from the loading unit 2 or the soaking plate 7 to the standby positions at both sides of the test sockets 11 of the test site 10. At one sides of the first and second shuttles 8a and 8b, third and fourth shuttles 9a and 9b are installed to move back and forth, respectively. The third and fourth shuttles 9a and 9b receive to transfer the test-completed semiconductor devices from the test site 10 to an outside of the test site 10.

Fixing frames 13 are installed at the front end of the handler body 1 and over the very front side of the test site 10 across the handler body 1, respectively. A pair of movable frames 14a and 14b are installed at the fixing frames 13 to move right and left along the fixing frames 13. And, two device transfer unit 15 are installed at the movable frames 14a and 14b to move along the movable frames 14a and 14b to pick up semiconductor devices, respectively. Each of the device transfer unit 15 includes a plurality of pickers (not shown in the drawing) to transport a plurality of the semiconductor devices simultaneously.

Meanwhile, a handler is constituted to carry out a test on such semiconductor devices as QFP, BGA, SOP, and the like. After one species of the semiconductor devices have been tested, another species of the semiconductor devices are tested. In such a case, the tray and change kits including the soaking plate 7, shuttles 8a, 8b, 9a, and 9c, test sockets 11, and the like are replaced by another change kits fitting to the semiconductor device species to carry out the test.

In this case, the change kits replaced according to the species of the test-expecting semiconductor devices differ from each other in sizes and thickness and the semiconductor device species differ from each other in thickness. Hence, working sections of the device transfer unit 15 should be reset.

However, in measuring the working height according to the semiconductor species and the options of the change kits to be replaced, an operator moves the device transfer unit 15 to pick & place positions one by one and then moves the device transfer unit 15 upward and downward to set up the working height. In such a case, a probability of error occurrence during input is high and a working height setup takes too much time. Hence, daily productivity is reduced and overall efficiency of the test work is decreased.

SUMMARY OF THE INVENTION

Accordingly, the present invention is directed to an apparatus and method for recognizing a working height of a carrier in a semiconductor device test handler that substantially obviate one or more problems due to limitations and disadvantages of the related art.

An object of the present invention is to provide an apparatus and method for recognizing a working height of a carrier in a semiconductor device test handler enabling to measure the working height of the carrier fast and precisely to reset with a simplified structure of the apparatus.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in a device transfer system for picking up to transfer semiconductor devices between a tray and a change kit by a command of a control unit of a handler, the device transfer system installed on a handler body to move horizontally and vertically, the device transfer system having a plurality of vertically movable pickers absorbing the semiconductor devices by suction, an apparatus for recognizing a working height in a semiconductor device test handler according to the present invention includes an elevating block installed at one side of the device transfer system to move upward and downward, a touch probe installed vertical to the elevating block to move upward and downward in accordance with a contact with an under target object, a detecting means for detecting ascendance of the touch probe by the contact between the touch probe and the target object, and a driving means for driving the elevating block upward and downward.

In another aspect of the present invention, in the above-explained apparatus for recognizing the working height, a method of recognizing the working height in a semiconductor device test handler includes the steps of finding an offset value ΔZ by a height difference between a lower end of a picker and a lower end of a touch probe and an offset value ΔZ0 by a detecting means to store the offset values ΔZ and ΔZ0 in a handler control unit, moving a device transfer system to a position of a recognizing object and actuating a driving means to lower an elevating block and the touch probe, lowering the device transfer system until the detecting means detects ascendance of the touch probe, acquiring a vertical position value h of the device transfer system when the detecting means detects a contact member; and calculating a work position value ΔH by compensating an offset value existing between a measuring means and a picker of the device transfer system for the vertical position value h.

Preferably, the step of finding the offset value ΔZ by the height difference between the lower end of a picker and the lower end of the touch probe and the offset value ΔZ0 by the detecting means includes a first step of installing a measuring jig on the handler body, disposing the device transfer system on the measuring jig, and lowering the touch probe, a second step of lowering the device transfer system until the touch probe touches the measuring jig to acquire a vertical position value Z1 at a moment that the touch probe touches the measuring jig, a third step of further lowering the device transfer system until the detecting means detects the touch probe to acquire a vertical position value Z0 at a moment that the detecting means detects the touch probe, a fourth step of elevating the elevating block and touch probe but lowering a picker, a fifth step of acquiring a vertical position value Z2 at a moment that the picker touches the measuring jig by lowering the device transferring means until the picker touches the measuring jig, and a sixth step of calculating the offset values ΔZ and ΔZ0 by the vertical position values Z1, Z0 and Z2 acquired in the second, third, and fifth steps to store in the handler control unit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 2:
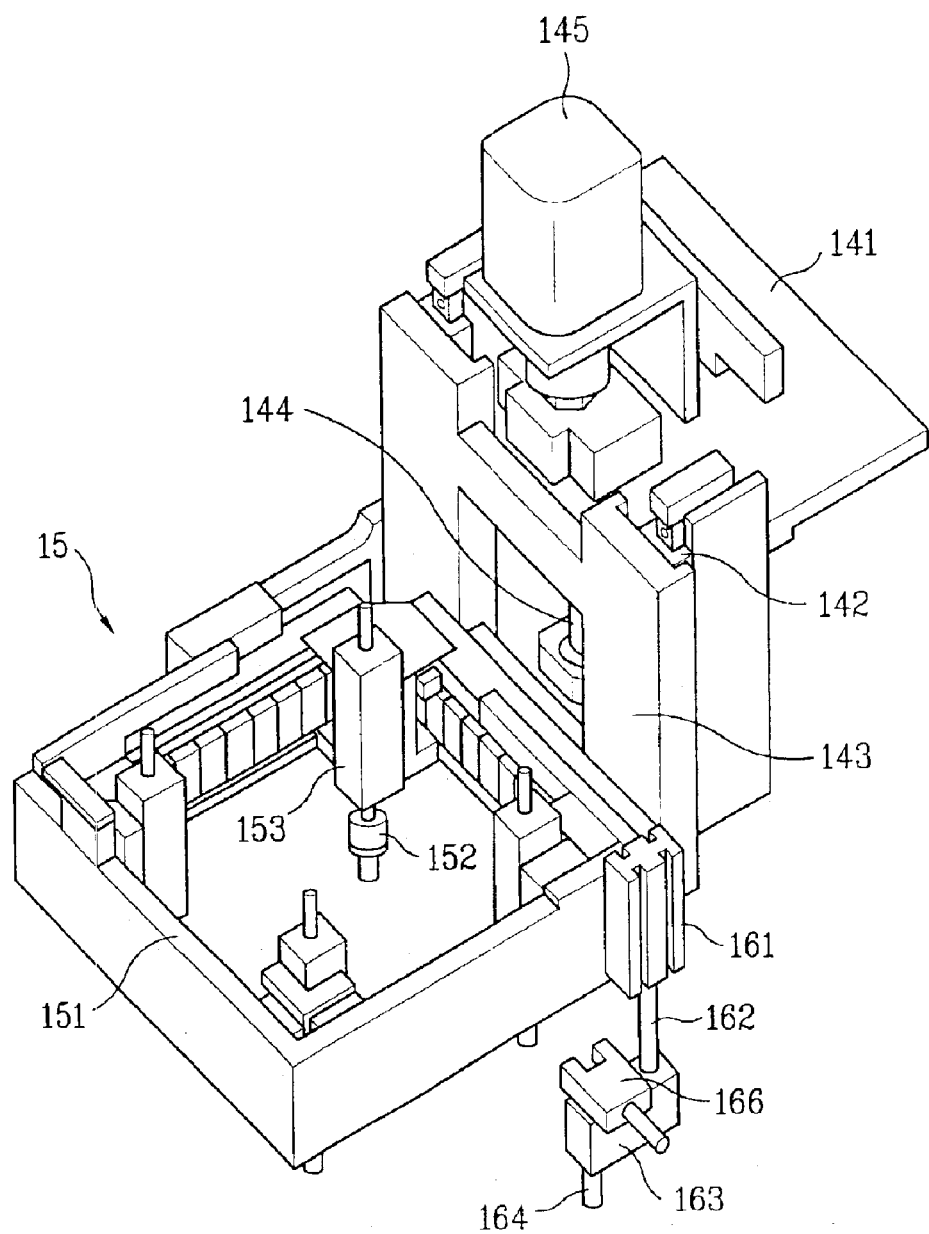
FIG. 2 illustrates a bird's-eye view of a carrier in a handler having an apparatus for recognizing a working height according to the present invention.

FIG. 2 illustrates a bird's-eye view of a carrier in a handler having an apparatus for recognizing a working height according to the present invention.

Figure 1:
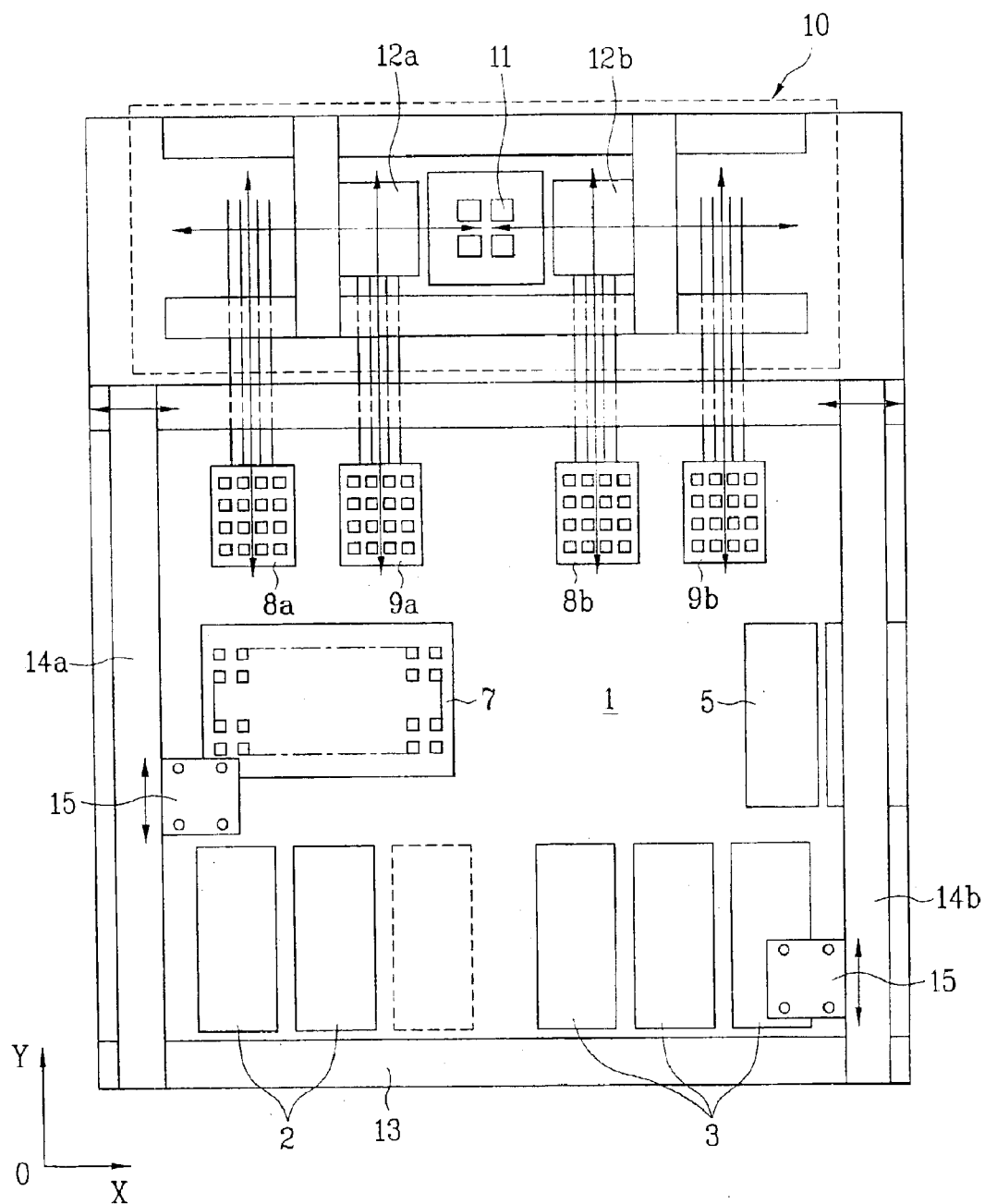
FIG. 1 illustrates a layout of a related art handler for semiconductor device test.

Referring to FIG. 2, a support block 143 is installed at one side of a movable block 141, which is installed to move along a movable frame 14a (cf. FIG. 1) of a handler, to move upward and downward through a guide member such as an LM guide 142. And, a device transfer unit 15 is fixed to the support block 143 to pick up a semiconductor device.

The support block 143 moves upward and downward along the LM guide 142 by a ball screw 144 installed vertical to the movable block 141 and a vertical axis servomotor 145 driving the ball screw 144.

And, the device transfer unit 15 includes a rectangular frame 151 and a plurality of pickers 152 installed to move inside the frame 151 wherein pitches of the pickers 152 are variable reciprocally. And, each of the pickers 152 is elevated upward or downward by an air-pressure cylinder 153 coupled inside the frame 151.

Figure 3:
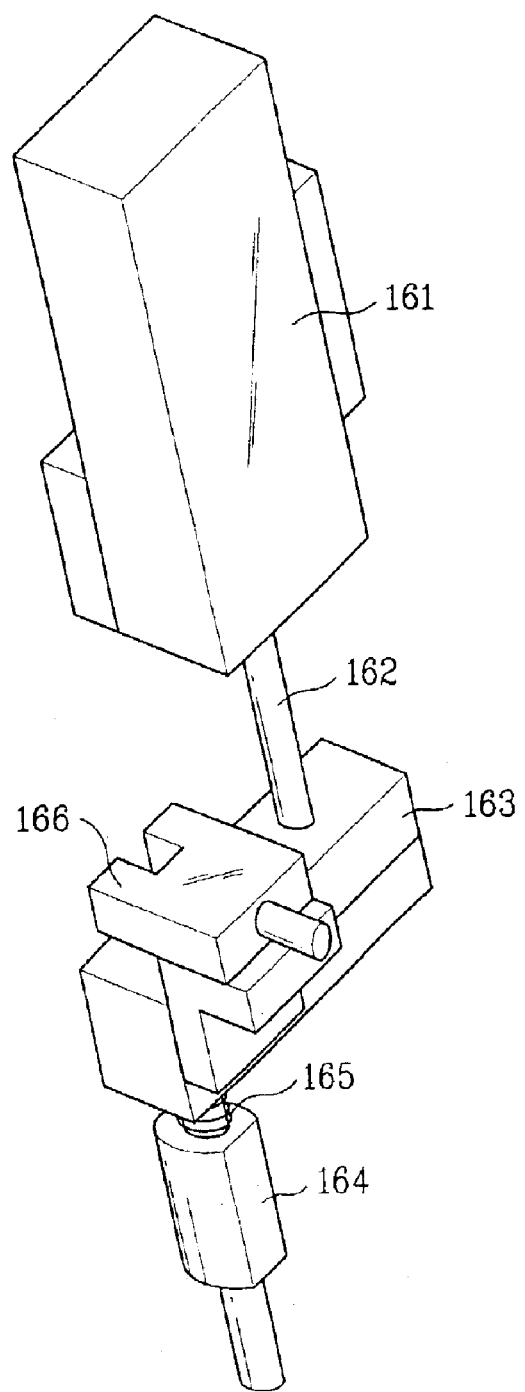
FIG. 3 illustrates a bird's-eye view of an apparatus for recognizing a working height according to the present invention.
Figure 4:
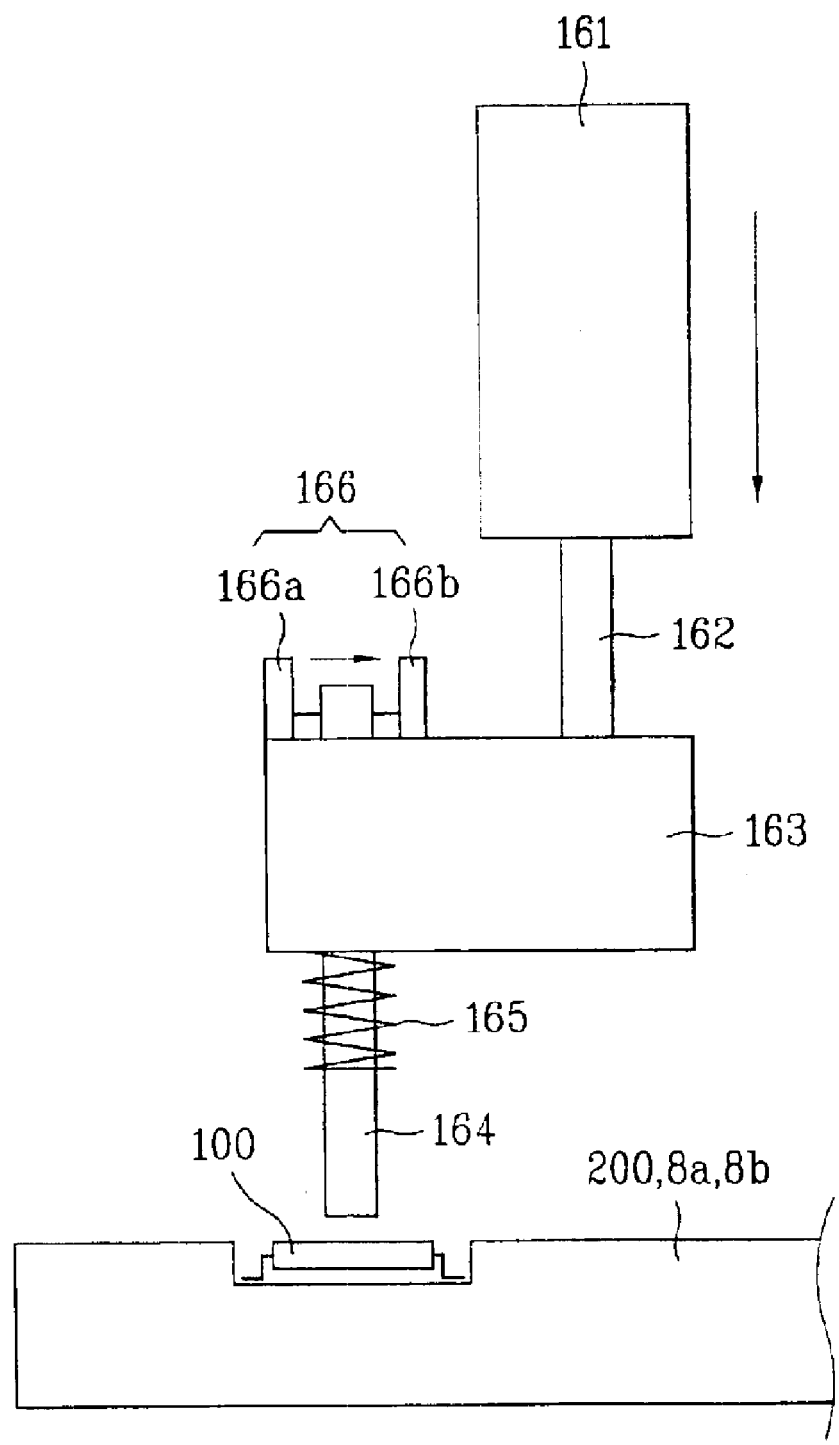
FIG. 4 illustrates a front view of an apparatus for recognizing a working height in FIG. 3 for explaining its operation.
Figure 5:
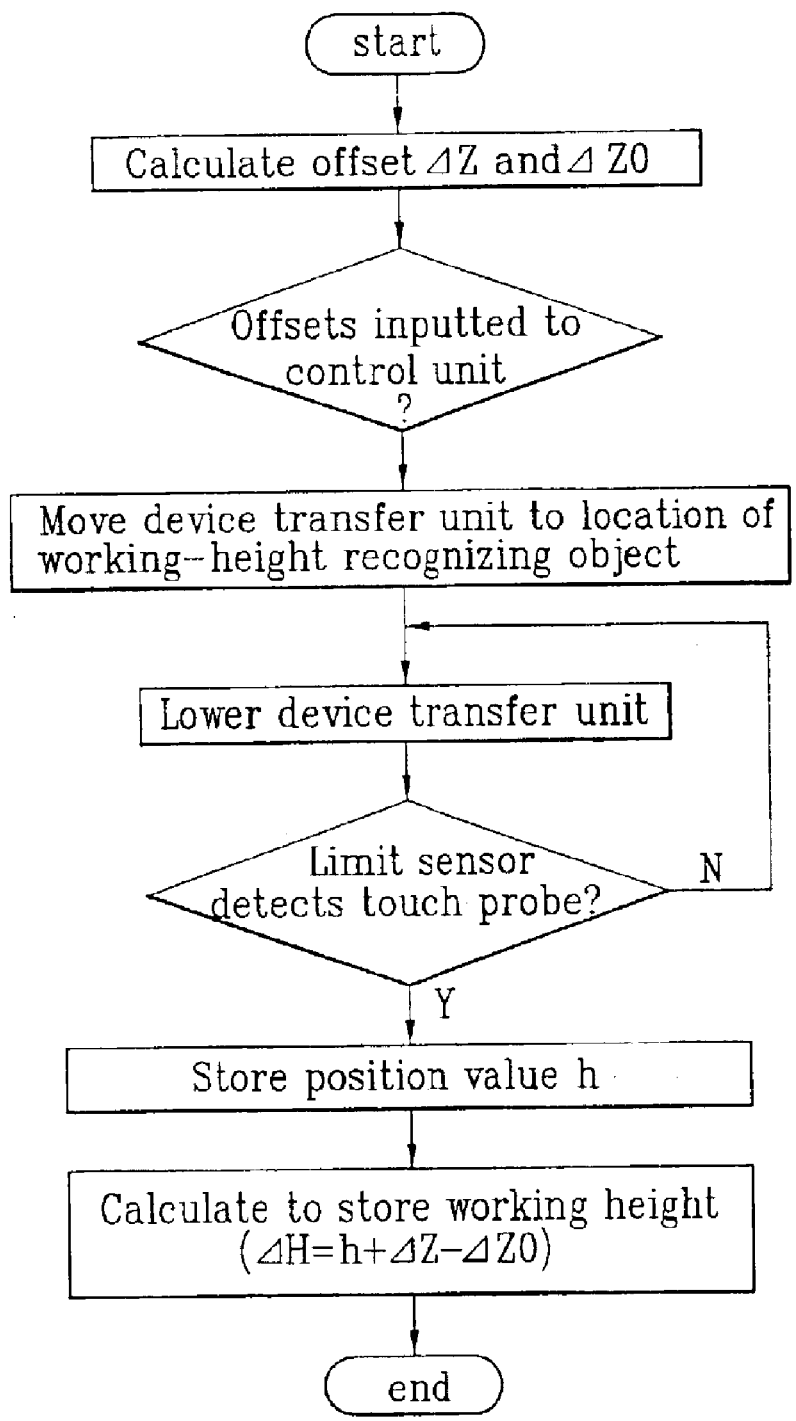
FIG. 5 illustrates a flowchart of a method of recognizing a working height according to the present invention.
Figure 6:
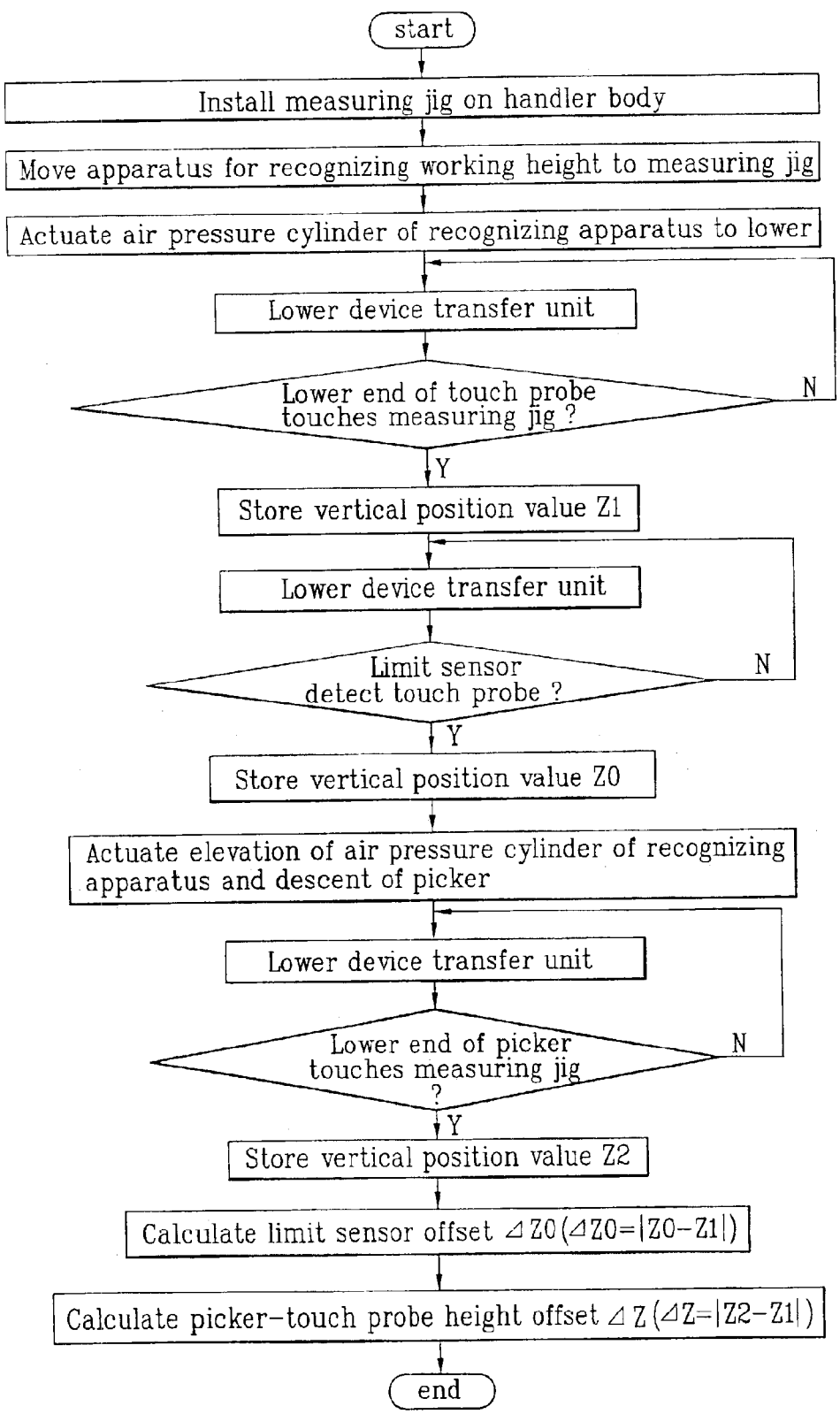
FIG. 6 illustrates a flowchart of finding an offset value to carry out the method of recognizing a working height in FIG. 5.

Moreover, an apparatus for recognizing a working height to measure the working height of the device transfer unit 15 is installed at one side of the frame 151. The apparatus for recognizing the working height, as shown in FIG. 2 to FIG. 4, includes an air pressure cylinder 161 fixed to one side of the frame 151, an elevating block 163 fixed to a lower end of a cylinder rod 162 of the air pressure cylinder 161, a touch probe 164 moving upward and downward through a ball bush (not shown in the drawing) coupled with the elevating block 163, and a limit sensor 166 installed at one upper side end of the elevating block 163 to detect elevation of an upper end of the touch block 164.

The touch probe 164 is supported elastically by a compression spring 165 coupled with a lower end of the elevating block 163. When the device transfer unit 15 descends so that the lower end of the touch probe 164 comes into contact with a certain object such as a measurement jig, the touch probe 164 goes up. If the contact is released, the touch probe 164 returns to its initial position by an elastic force of the compression spring 165.

Besides, the limit sensor 166 is an LED sensor including a light-emitting unit 166a emitting a beam and a light-receiving unit 166b installed to leave a predetermined interval from the light-emitting unit 166a wherein the beam emitted from the light-emitting unit 166a becomes incident on the light-receiving unit 166b. When the touch probe 164 ascends so that the upper end of the touch probe 164 is disposed between the light-emitting and light-receiving units 166a and 166b, a propagating path of the beam is blocked so that the limit sensor 166 detects the elevation of the touch probe 164.

Operation of the apparatus for recognizing the working height according to the present invention is explained as follows.

First of all, the vertical axis servomotor 145 is operated to lift the device transfer unit 15 to a reference height, the air pressure cylinder 153 for driving the picker is actuated to elevate the picker 152, and then the device transfer unit 15 is moved to a working height measuring position, i.e. an upper side of the change kits such as the tray 200 and the shuttles 8a, 8b, 9a, and 9c.

Subsequently, the air pressure cylinder 161 of the apparatus for recognizing the working height is operated to lower the cylinder rod 162 so that the lower end 164 of the touch probe 164 is disposed lower than that of the picker 152.

The vertical axis servomotor 145 is then driven to lower the cylinder rod 162 slowly. The descent of the device transfer unit 15 proceeds until the sensor 166 detects the upper end of the touch probe 164 as the touch probe 164 comes into contact with the tray 200 or the semiconductor device 100 on the change kit.

Once the sensor 166 detects the upper end of the touch probe 164, a detecting signal is transferred to a control unit (not shown in the drawing). The control unit then reads a position value of the device transfer unit to calculate a working height.

Yet, such a position value found through the above-explained height measuring process is for the height between the semiconductor device 100 mounted on the handler body and the touch probe 164 of the recognizing apparatus. Between the picker 152 and the recognizing apparatus, one offset value by the installed positions and the other offset value by the ascendance amount of the touch probe 164 of which upper end is detected by the limit sensor 166 exist. Hence, the actual working height of the picker 152 is calculated by compensating theses offset values.

A method of recognizing a working height accomplished by the apparatus for recognizing the working height according to the present invention is explained in detail as follows.

First of all, the information about the offset values should be inputted previously to the control unit (not shown in the drawing) of the handler before the actual working height is calculated. A height offset between the picker 152 and touch probe 164 and an offset of the limit sensor 166 are found in a following manner.

First of all, a measuring jig (not shown in the drawing) is put on a random point on the handler body and the device transfer unit 15 is disposed right over the measuring jig.

The air pressure cylinder 153 of the device transfer unit 15 is actuated to lower the picker 152, and then the other air pressure cylinder 161 of the apparatus for recognizing the working height is lowered so that the lower end of the touch probe 164 is disposed below that of the picker 152.

Subsequently, the vertical axis servomotor 145 is actuated to lower the device transfer unit 15 slowly. In this case, the descent of the device transfer unit 15 is carried out until the lower end of the touch probe 164 touches the upper surface of the measuring jig. And, a vertical position value Z1 at this moment is encoded to store in the control unit (not shown in the drawing) of the handler.

The device transfer unit 15 is then lowered farther until the limit sensor 166 of the recognizing apparatus detects the touch probe 164. And, a vertical position value Z0 at the moment that the limit sensor 166 detects 164 the touch probe 164 is encoded to store in the control unit.

And, the air pressure cylinder 161 of the recognizing apparatus is actuated to ascend the touch probe 164 and the picker 152 is descended, whereby the lower end of the picker 152 is disposed below that of the touch probe 164. The device transfer unit 15 is then lowered until the lower end of the picker 152 touches the upper surface of the measuring jig. And, a vertical position value at the moment that the lower end of the picker 152 touches the upper face of the measuring jig is encoded to store.

An offset $\Delta Z0$ of the limit sensor 166 and a height offset $\Delta Z$ between the picker 152 and touch probe 164 are calculated as follows.

$$\Delta Z0 = |Z0 - Z1|$$

$$\Delta Z = |Z2 - Z1|$$

The above-found offset values are stored in the control unit of the handler to use for finding the actual working height by the recognizing apparatus.

Once the offset values are found, the operator enables to find the working height automatically in accordance with the replaced semiconductor device and change kit.

For instance, in case the working height of the device transfer unit 15 is to be found in the loading unit 2 (cf. FIG. 1) of the handler, after the device transfer unit 15 has been moved toward an upper side of the tray (not shown in the drawing) of the loading unit 2, the cylinder rod 162 of the air pressure cylinder 161 of the apparatus for recognizing the working height is lowered to descend the touch probe 164.

Subsequently, the device transfer unit 15 is lowered slowly. Once the touch probe 164 comes into contact with the semiconductor device on the tray so that the limit sensor 166 detects the upper end of the touch probe 164, a vertical position value h at this moment is encoded to store in the control unit (not shown in the drawing) of the handler.

And, the control unit of the handler calculates to recognize an actual working height $\Delta H$ of the device transfer unit 15 by the above-found vertical position value h and offset values.

$$\Delta H = h + \Delta Z - \Delta Z0$$

In case that a working height of the device transfer unit 15 in the soaking plate 7 (cf. FIG. 1) and shuttles 8a, 8b, 9a, and 9b (cf. FIG. 1) of the handler, since the semiconductor devices fail to be mounted on the soaking plate 7 and shuttles 8a, 8b, 9a, and 9b, a height between the soaking plate 7 and a semiconductor device landing surface of the surfaces of the shuttle 8a, 8b, 9a, or 9b is measured and then a thickness of the semiconductor device is subtracted from this height.

In case of calculating to recognize the working height $\Delta H$ of the device transfer unit 15 as well as the thickness of the semiconductor device, random necessary factors due to the various reasons of the structure and operation of the handler are added to or subtracted from the above equation to recognize the height precisely.

Accordingly, the simple construction of the present invention enables to measure the working height of the device carrier automatically. Therefore, in resetting the height of the device carrier after replacement of the tray and change kit, the present invention reduces time and improves precision, thereby enabling to improve test efficiency.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An apparatus for recognizing working height of a device transfer system in a semiconductor device test handler, wherein the device transfer system comprises a plurality of pickers configured to move in a horizontal and a vertical direction and to transfer devices between trays and change kits upon receiving a command of a control unit from the semiconductor device handler, the apparatus comprising:

an elevating block installed at one side of the device transfer system and configured to move upward and downward;

a probe installed in a vertical position relative to the elevating block and configured to move upward and downward based on contact with a target object, and to provide positional information related to the target object based on the upward and downward movement of the probe;

a detector configured to detect an ascendance of the probe due to contact between the probe and the target object; and a driver configured to drive the elevating block upward and downward.

2. The apparatus according to claim 1, wherein the detector comprises a limit sensor, the limit sensor comprising:

a light-emitting unit fixed to one upper end of the elevating block and configured to emit light; and a light-receiving unit positioned at a predetermined interval from the light-emitting unit and configured to receive the light emitted from the light-emitting unit, wherein the detector is configured to detect an ascendance of the probe when an upper end of the probe ascends through a space formed between the light-emitting and light-receiving units.

3. The apparatus according to claim 1, wherein the driver comprises an air pressure cylinder fixed to a side of the device transfer system.

4. The apparatus according to claim 1, wherein the control unit is configured to determine a working height for the device transfer system based on positional information comprising an initial position of the device transfer system, and on dimensional characteristics comprising at least one measurement associated with at least one of the probe, the detector, and one of the plurality of pickers.

5. The apparatus according to claim 4, wherein the at least one measurement comprises a plurality of measurements based on dimensional characteristics of each of the probe, the detector, and one of the plurality of pickers.

6. The apparatus according to claim 1, wherein the positional information comprises at least one vertical position value associated with the device transfer system, and wherein the control unit is configured to store and to retrieve a plurality of offset values and the at least one vertical position value.

7. The apparatus according to claim 6, wherein the plurality of offset values comprises:

a first offset value based on a dimensional difference between a lower end of the at least one picker and a lower end of the probe; and a second offset value based on a detected ascendance of the probe and a dimensional characteristic of the detector.

8. The apparatus according to claim 6, further comprising a measuring jig provided on a surface of the handler, wherein the at least one vertical position value comprises a first vertical position value, a second vertical position value, and a third vertical position value.

9. The apparatus according to claim 8, wherein the first, second, and third vertical position values are based on first, second, and third measurements of a position of the device transfer system relative to the measuring jig, respectively.

10. The apparatus according to claim 1, wherein the probe comprises a touch probe.

11. A method of recognizing a working height of a device transfer system, comprising:

determining an offset value $\Delta Z$ based on a height difference between a lower end of a picker and a lower end of a probe;

determining an offset value $\Delta Z0$ based on a position detected by a detector;

storing offset values $\Delta Z$ and $\Delta Z0$ in a handler control unit moving the device transfer system in line with a recognizing object and actuating a driver so as to lower the probe;

lowering the probe until the detector detects ascendance of the probe and determining a corresponding vertical position value h of the device transfer system; and calculating a work position value $\Delta H$ based on the vertical position value h, the offset value $\Delta Z$, and the offset value $\Delta Z0$.

12. The method of claim 11, wherein determining the offset value $\Delta Z$ and determining the offset value $\Delta Z0$ comprises:

installing a measuring jig on a surface of the handler, disposing the device transfer system on the measuring jig, and lowering the probe;

lowering the device transfer system until the probe touches the measuring jig and determining a vertical position value Z1 when the probe touches the measuring jig;

further lowering the device transfer system until the detector detects the probe and determining a vertical position value Z0 when the detector detects the probe;

elevating an elevating block and the probe, and lowering the picker;

lowering the device transfer system until the picker touches the measuring jig, and determining a vertical position value Z2 when the picker touches the measuring jig; and calculating the offset values $\Delta Z$ and $\Delta Z0$ based on vertical position values Z1, Z0 and Z2, and storing offset values $\Delta Z$ and $\Delta Z0$ in a handler control unit.

13. The method of claim 12, wherein $\Delta Z=|Z2-Z1|$ and $\Delta Z0=|Z0-Z1|$.

14. An apparatus for recognizing working height of a device transfer system in a device handler, comprising:

a block installed at a side of the device transfer system and configured to move in a vertical direction;

a probe configured to move in a vertical direction relative to the block;

a detector configured to detect ascendance of the probe; and a control unit configured to determine a working height of the device transfer system based on positional information garnered from the vertical movement of the probe and the ascendance detected by the detector.

15. The apparatus according to claim 14, wherein the probe is configured to move upward and downward relative to the block based on contact with a target object.

16. The apparatus according to claim 15, wherein the detector comprises:

a light emitting portion fixed to an end of the block and configured to emit light; and a light receiving portion positioned at a predetermined interval from the light emitting portion and configured to receive the light emitted from the light emitting portion, wherein the detector is configured to detect ascendance of the probe when an upper end of the probe enters a space formed between the light emitting portion and the light receiving portion.

17. The apparatus according to claim 15, wherein the probe comprises a touch probe configured to move upward and downward based on contact made between a lower end of the touch probe and a target object.

18. The apparatus according to claim 15, further comprising a driver configured to drive the block in a vertical direction, wherein the driver comprises an air pressure cylinder positioned on a side of the device transfer system.

19. The apparatus according to claim 14, further comprising at least one picker configured to transfer devices between trays and change kits of the device handler.

20. The apparatus according to claim 19, wherein the positional information comprises an initial position of the device transfer system, and wherein the control unit is configured to determine a working height for the device transfer system based on the initial position of the device transfer system and at least one measurement associated with at least one of the probe, the detector, and the at least one picker.

21. The apparatus according to claim 20, wherein the at least one measurement comprises a plurality of measurements based on dimensional characteristics of the probe, the detector, and the at least one picker.

22. The apparatus according to claim 14, wherein the positional information comprises at least one vertical position value of the device transfer system, and wherein the control unit is configured to store and to retrieve a plurality of offset values and the at least one vertical position value.

23. The apparatus according to claim 22, wherein the plurality of offset values comprises:

a first offset value based on a dimensional difference between a lower end of the at least one picker and a lower end of the probe; and a second offset value based on a detected ascendance of the probe and a dimensional characteristic of the detector.

24. The apparatus according to claim 22, further comprising a measuring jig provided on a surface of the handler, wherein the at least one vertical position value comprises a first vertical position value, a second vertical position value, and a third vertical position value.

25. The apparatus according to claim 24, wherein the first, second and third vertical position values are based on first, second and third measurements of a position of the device transfer system relative to the measuring jig, respectively.

26. A method of recognizing a working height of a device transfer system in a device handler, comprising:

determining a first offset value based on a position of a picker of the device transfer system relative to a position of a probe of the device transfer system;

determining a second offset value based on a position of a limit sensor of the device transfer system;

positioning the device transfer system in line with a target object;

lowering the probe until the limit sensor senses ascendance of the probe and determining a corresponding vertical position value of the device transfer system; and determining a work position value based on the vertical position value, the first offset value, and the second offset value.

27. The method of claim 26, wherein the first offset value is based on a height difference between a lower end of the picker and a lower end of the probe.

28. The method of claim 26, wherein the second offset value is based on a distance moved by the probe from a point at which a first end of the probe contacts a jig installed on a surface of the device handler to a point at which a second end of the probe is sensed by the limit sensor.

29. The method of claim 26, wherein determining the second offset value comprises:

installing a measuring jig on the surface of the device handler;

positioning the device transfer system on the measuring jig;

lowering the device transfer system until the probe contacts the measuring jig;

determining a first vertical position value when the probe contacts the measuring jig;

further lowering the device transfer system until the limit sensor senses the probe;

determining a second vertical position value when the limit sensor senses the probe; and determining the second offset value based on the absolute value of the difference between the first vertical position value and the second vertical position value.

30. The method of claim 29, wherein determining the first offset value comprises:

installing a measuring jig on the device handler;

positioning the device transfer system on the measuring jig;

lowering the device transfer system until the probe contacts the measuring jig;

determining a first vertical position value when the probe contacts the measuring jig;

further lowering the device transfer system until the limit sensor senses the probe;

determining a second vertical position value when the limit sensor senses the probe;

elevating the probe and lowering the picker;

further lowering the device transfer system until the picker contacts the measuring jig;

determining a third vertical position value when the picker touches the measuring jig; and determining the first offset value based on the absolute value of the difference between the third vertical position value and the second vertical position value.

* * * * *